United States Patent [19]

Braun

[11] Patent Number: 4,882,657

[45] Date of Patent: Nov. 21, 1989

[54] PIN GRID ARRAY ASSEMBLY

[75] Inventor: Randall E. Braun, Santa Cruz, Calif.

[73] Assignee: ICI Array Technology, Inc., San Jose, Calif.

[21] Appl. No.: 178,109

[22] Filed: Apr. 6, 1988

[51] Int. Cl.⁴ .............................................. H05K 1/00
[52] U.S. Cl. ....................................... 361/412; 439/91
[58] Field of Search ............... 361/410, 412, 413, 414; 439/86-91

[56] References Cited

U.S. PATENT DOCUMENTS

| | | |
|---|---|---|
| 3,278,890 | 10/1966 | Cooney . |
| 3,537,176 | 11/1970 | Healy et al. .......................... 361/412 |
| 3,701,965 | 10/1972 | DuRocher et al. . |
| 3,870,385 | 3/1975 | Avakian et al. . |
| 4,221,444 | 9/1980 | Patrick . |
| 4,252,391 | 2/1981 | Sado . |
| 4,252,990 | 2/1981 | Sado . |
| 4,295,699 | 10/1981 | DuRocher . |
| 4,342,069 | 7/1982 | Link ..................................... 361/395 |
| 4,364,100 | 12/1982 | Edmonds ............................. 361/395 |
| 4,421,370 | 12/1983 | Treakle et al. . |
| 4,437,141 | 3/1984 | Prokop ................................. 361/412 |
| 4,484,054 | 11/1984 | Morino . |
| 4,593,961 | 6/1986 | Cosmo . |
| 4,601,526 | 7/1986 | White et al. . |
| 4,620,761 | 11/1986 | Smith et al. . |
| 4,636,018 | 1/1987 | Stillie . |
| 4,655,524 | 4/1987 | Etzel . |
| 4,729,166 | 3/1988 | Lee et al. . |

*Primary Examiner*—Roy N. Envall, Jr.
*Attorney, Agent, or Firm*—Skjerven, Morrill, MacPherson, Franklin & Friel

[57] ABSTRACT

An electronic assembly includes a body having semiconductor devices positioned on one or more surfaces thereof, and a plurality of vias therethrough operatively connected with the semiconductor devices, the vias being positionable into contact with elastomer conductors which in turn are in contact with the recessed heads of pins of a pin grid array. The body and pin grid array are brought together to form such assembly, being held together but resiliently urged apart by the elastometer conductors in contact with the pins and the vias.

8 Claims, 2 Drawing Sheets

PIN GRID ARRAY ASSEMBLY

BACKGROUND OF THE INVENTION

1. Field of the Invention

This invention relates to electrical packages, and more particularly, to an electronic pin grid array assembly.

2. Description of the Prior Art

A typical pin grid array assembly 10 of the prior art is shown in FIG. 1. Such an assembly 10 includes a pin grid array 11 having a body 12, which typically may be of molded or ceramic material, and which defines a plurality of holes 14 in which are rigidly fitted pins 16. These pins 16 extend entirely through the body 12 and beyond the opposite sides or surfaces 18, 20 thereof. Further included in the assembly 10 is a circuit board or base 22 which includes a plurality of passages 24 therethrough from one side or surface 26 thereof to the opposite side or surface 28. The positions of the passages 24 generally correspond to the positions of respective pins 16 of the pin grid array 11. The circuit board 22 has, in these passages 24, conductive metal material 30 which extends into metal conductors 32, 34, 36 on the opposite surfaces 26, 28 of the circuit board 22. The surface 26 also has disposed on it other metal conductors 37, 38, 39, 40 and metal pads 42, 44, 46 for the placement and fixing of semiconductor devices in the form of semiconductor chips 48, 50, 52, respectively. Wires 54 connect the metal conductors 32, 36, 37, 38 with the semiconductor chips 48, 50, 52, as is well known.

In the assembly 10, the pin grid array 11 and circuit board 22 are brought together to bring the ends of the pins 16 extending beyond surface 18 into respective openings 56 defined by the metal material 30. Solder 58 is applied into the openings 56 to connect the circuit board 22 with the pin grid array 11. The ends of the pins 16 which extend beyond the surface 20 can then be fitted to an interconnection board, as is well known.

A problem with this type of assembly is that a substantial amount of area of the surface 26 of the circuit board 22 cannot be used for the placement of semiconductor chips because the 16 pins and their associated structure (i.e., the metal material 30 and solder 32) preclude their placement in such area. Furthermore, addition of pins makes this problem even more extreme, taking up more such valuable area of the circuit board 22, which could with advantages be used for the placement of active and passive electronic devices.

It will furthermore be seen that the assembly 10 has the disadvantage that once solder 58 is placed in the openings 56 to connect the circuit board 22 with the pin grid array 11, these components cannot readily be separated.

SUMMARY

It is accordingly an object of this invention to provide a pin grid array assembly which maximizes the area on which semiconductor devices may be located and assembled.

It is a further object of this invention to provide a pin grid array assembly including a pin grid array and a circuit board which are readily disconnectable, yet can be connected in a simple and effective manner.

Broadly stated, the invention comprises a pin grid array assembly including a circuit board base on which an electrical component, such as a semiconductor device, may be mounted. A first conductive member is fixed to the circuit board base and is connectable to such a mounted electrical component. Further included is a pin grid array having a body including a plurality of pins therein, the body being mountable to the circuit board base. A resilient conductive member provides connection between a pin and the first conductive member when the body is mounted to the circuit board base. The resilient conductive member takes the form of an elastomer, fitted into a recess in the body of the pin grid array, and against a recessed end of the pin associated therewith. Means are included for readily removably mounting the body to the circuit board base against the resilience of this resilient member.

BRIEF DESCRIPTION OF THE DRAWINGS

Other objects of the invention will become apparent from a study of the following specification and drawings, in which.

DESCRIPTION OF THE PREFERRED EMBODIMENT

Figure 1:
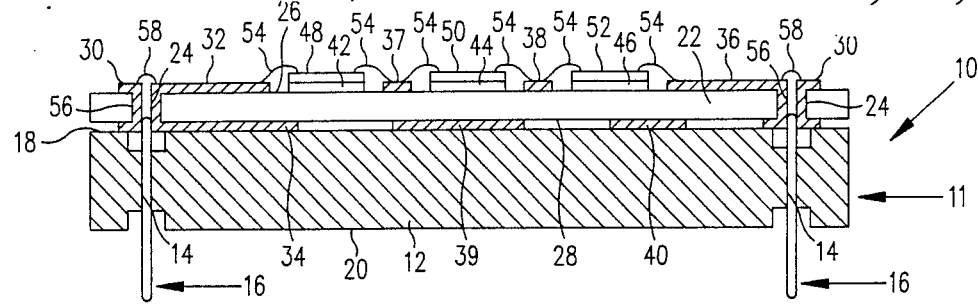
FIG. 1 is a sectional view of a typical prior art pin grid array.
Figure 2:
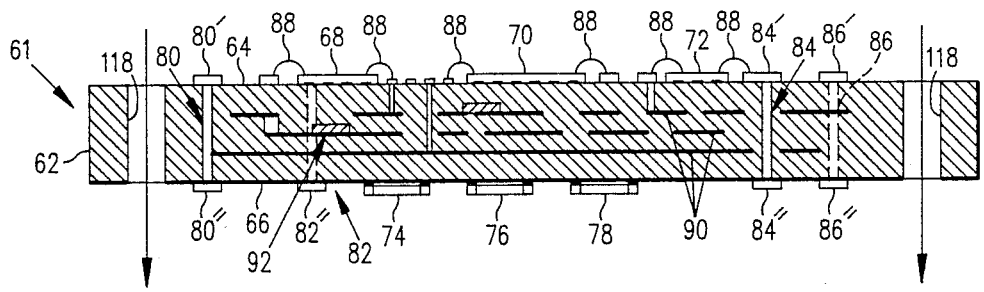
FIG. 2 is a sectional view of a first embodiment of the present pin grid array.
Figure 2:
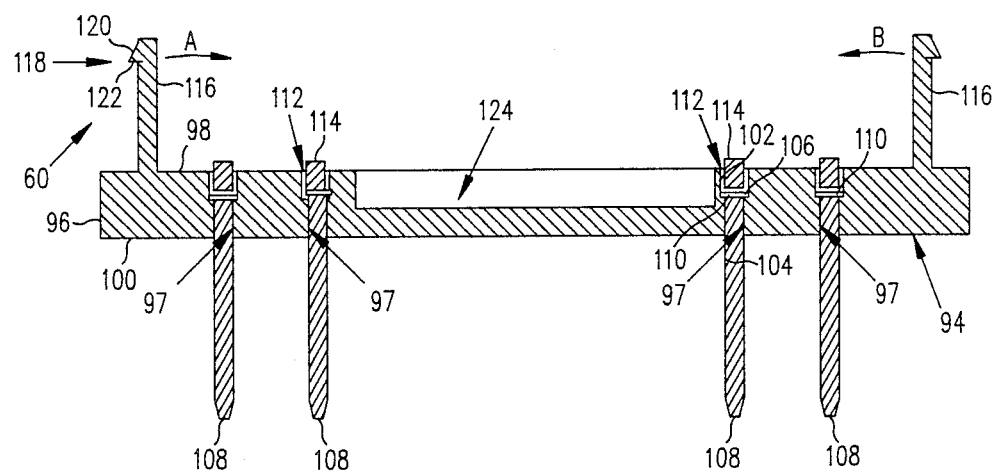

Shown in FIG. 2 is the present pin grid array assembly 60, indicated in separated or exploded form. The pin grid array assembly 60 includes an assembly 61 including a base or circuit board 62 which may be of, for example, ceramic or molded material, and having opposite sides or surfaces 64, 66, semiconductor chips 68, 70, 72 being fitted on the surface 64 and discrete semiconductor devices 74, 76, 78 being fitted on the surface 66 (on pads, as appropriate). Conductive members in the form of metal vias 80, 82, 84, 86 extend through the circuit board 62 from one surface 64 to the other surface 66, and have plated ends 80', 80'', 82', 82'', 84', 84'', 86', 86'' thereon, on the respective opposite surfaces 64, 66 of the circuit board 62. These vias 80, 82, 84, 86 connect with the semiconductor chips and devices 68-78 through conductive leads 88 and through internal conductors 90 and resistors 92.

The pin grid array of the assembly is shown at 94. The pin grid array 94 includes a molded body 96 having a plurality of apertures 97 therethrough from one side or surface 98 thereof to the opposite side or surface 100 thereof. Each aperture 97 actually has a larger diameter portion 102 connected to surface 98, and a smaller diameter portion 104 connected to surface 100, the portions 102, 104 connected by a step portion 106. Pins 108 are molded or press-fitted into the respective smaller diameter portions 104 of the apertures 97. Heads 110 of the respective pins 108, which are larger in diameter than the diameter of the smaller diameter portions 104, sit within the larger diameter portions 102 and against the steps 106 in the apertures 97, resulting in the body 96 defining recesses 112. Into these recesses 112 are fitted respective resilient, elastomeric conducting members 114 which can take the form of silver impregnated silicone, and which, when seated against the heads 110 of the respective pins 108, extend somewhat beyond the surface 98 of the body 96.

The body 96 of the pin grid array 94 also defines alignment and clamping arms 116 (which may be molded of the same material as the main portion of the body 96, or which may be separate metal pieces fixed thereto), which are fittable into and through bores 118 in the circuit board 62. The arms 116 are somewhat resilient in construction, and define protrusions 118 having angled surfaces 120 which determine that when the body 96 and circuit board 62 are brought together, the arms 116 move inwardly (in the directions A, B, as shown) in contact with the inner surfaces of the respective bores 118, until the surfaces 122 of protrusions 118 reach beyond the surface 64 of the circuit board 62 and move under the resilience of the arms 116 into contact with the surface 64, the body 96, circuit board 62 and associated members and structural features being sized so that the body 96 and circuit board 62 tend to be urged apart by the conductive elastomers 114 when the surfaces 122 of the arms are in contact with the surface 64 of the circuit board 62. Thus, when the body 96 and circuit board 62 are mounted together, this mounting is against the resilience of the elastomers 114, providing a stable connection and fit of the body 96 and circuit board 62 together. It will readily be seen that the body 96 and circuit board 62 can be disattached easily by simple bending of the clamping arms 116 inward (directions A and B) to allow the arms 116 to be removed from the respective bores 118.

A cavity 124 is molded in the body 96 to allow positioning therewithin of the semiconductor devices 74, 76, 78 positioned on the surface 66 of the circuit board 62 when the body 96 and circuit board 62 are so assembled.

Figure 3:
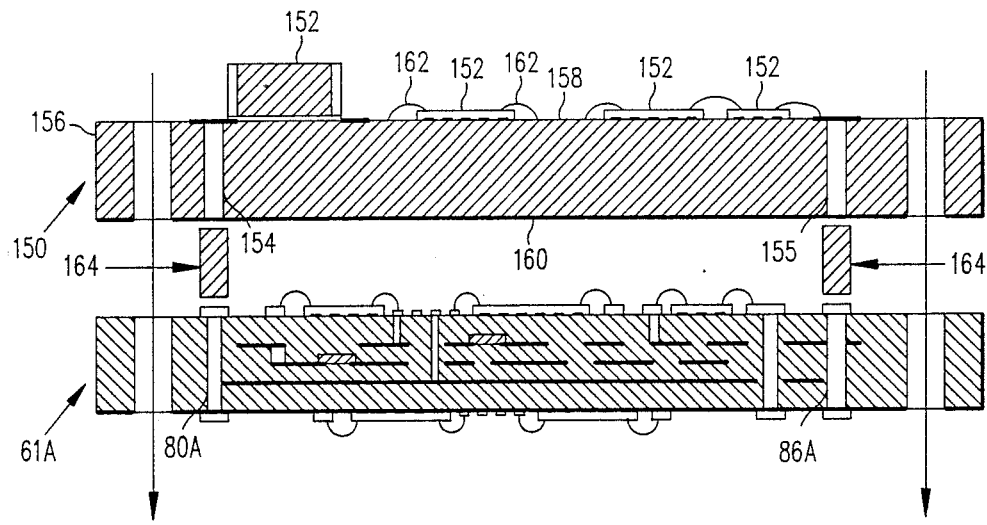
FIG. 3 is a sectional view of a second embodiment of the present pin grid array.
Figure 3:
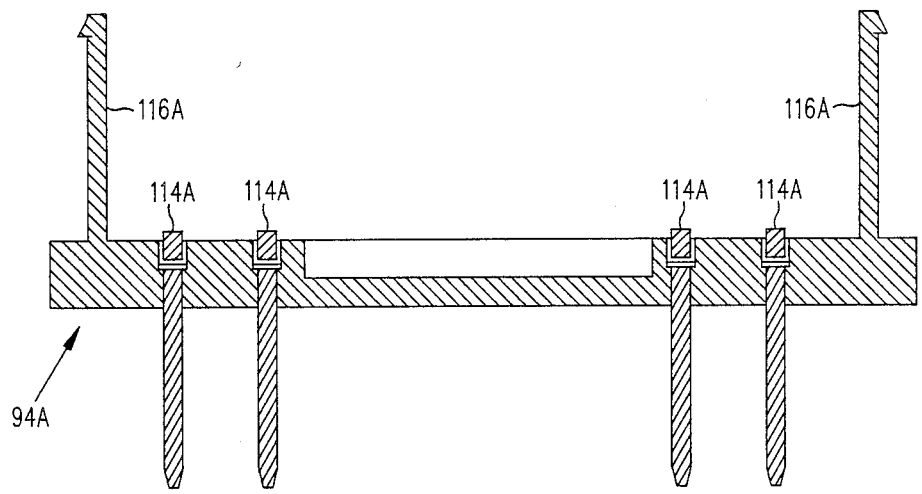

Shown in FIG. 3 is another embodiment of the invention. In this embodiment, the base or circuit board assembly 61A and pin grid array 94A are very similar to the corresponding items of FIG. 2. However, in this embodiment, another base or circuit board assembly 150 is provided, on which electrical components such as semiconductor devices 152 (in the form of semiconductor chips and a discrete semiconductor device) may be mounted on a surface 158 thereof. The semiconductor devices 152 connect with conductive members in the form of metal vias 154, 155 (which extend through the circuit board 156 from one surface 158 to the other, opposite surface 160), by means of wire leads 162 or the like, as previously described. In this embodiment, additional conductive elastomeric members 164, similar to those previously described, are positioned between the vias 154, 80A, respectively, and vias 155, 86A, respectively, and the alignment and clamping arms 116A are longer than in the embodiment of FIG. 2, being appropriately lengthened so that a holding action of the assembly 150, assembly 61A, and body 94A together is provided against the resilience of the elastomeric conductors 114A and the elastomeric conductors 164.

It will thus readily be seen that in the embodiment of FIG. 2, substantially the entire surface 64 of the circuit board 62 is available for the placement of semiconductor devices, including those portions of the surface 64 lying directly over the pins 108 of the pin grid array 94. Also, a substantial portion of the other surface 66 of the circuit board 62 is available for the placement of semiconductor devices.

Similarly, in FIG. 3, almost the entire area of the surface 158 of the circuit board 156 is available for the placement of semiconductor devices, in addition to the placement of semiconductor devices on the circuit board of assembly 61A.

I claim:

1. A pin grid array assembly comprising:
   a base on which an electrical component such as a semiconductor device may be mounted;
   a first conductive member fixed to said base and connectable to such a mounted electrical component;
   a pin grid array including a body having a plurality of pins therein, the body being mountable to the base; and
   a second conductive member which is resilient for providing connection between a pin and the first conductive member when the body is mounted to the base.

2. The structure of claim 1 wherein said body defines a recess in which said second conductive member is positionable 3. The structure of claim 1 and further comprising means for mounting the body to the base against the resilience of the second conductive member.

4. The structure of claim 1 wherein the second conductive member comprises an elastomer.

5. The structure of claim 1 wherein the electrical component is positionable on said base so that the second conductive member is positioned generally between the pin to which that second conductive member is associated and such an electrical component.

6. The structure of claim 1 wherein the base has a pair of generally opposite surfaces and further comprising at least one electrical component on each such surface of the base.

7. The structure of claim 1 wherein the body defines a cavity into which an electrical component mounted on the base fits with the body mounted to the base.

8. The structure of claim 1 and further comprising a second base on which an electrical component such as a semi-conductor device may be mounted; a third conductive member fixed to the base and connectable to such an electrical component mounted on the second base; and a fourth, resilient conductive member for providing connection between the first conductive member fixed to the first-mentioned base and the third conductive member fixed to the second base.

* * * * *